(12) United States Patent
Qian et al.

(10) Patent No.: US 8,097,890 B2
(45) Date of Patent: Jan. 17, 2012

(54) IMAGE SENSOR WITH MICRO-LENSES OF VARYING FOCAL LENGTHS

(75) Inventors: WeiDong Qian, Los Gatos, CA (US); Hsin-Chih Tai, Cupertino, CA (US); Vincent Venezia, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 40 days.

(21) Appl. No.: 12/029,400

(22) Filed: Feb. 11, 2008

(65) Prior Publication Data

US 2009/0200623 A1 Aug. 13, 2009

(51) Int. Cl.
*H01L 33/00* (2010.01)

(52) U.S. Cl. ......... 257/98; 257/116; 257/184; 257/222; 257/291; 257/E31.127

(58) Field of Classification Search .................. 257/184, 257/186, 187, 192, 201, 222, 226, 291, 461, 257/509, 927, 98, 116
See application file for complete search history.

(56) References Cited

U.S. PATENT DOCUMENTS

| 6,429,036 | B1 | 8/2002 | Nixon et al. |
| 6,660,988 | B2 | 12/2003 | Lee et al. |
| 7,262,448 | B2 | 8/2007 | Kim |
| 2002/0162943 | A1* | 11/2002 | Lee et al. .................. 250/208.1 |
| 2003/0025160 | A1* | 2/2003 | Suzuki et al. ................. 257/347 |
| 2005/0280012 | A1* | 12/2005 | Boettiger et al. ............... 257/88 |
| 2006/0114570 | A1* | 6/2006 | Ozawa ......................... 359/626 |
| 2008/0007839 | A1* | 1/2008 | Deng et al. .................... 359/642 |

* cited by examiner

*Primary Examiner* — Wai Sing Louie
(74) *Attorney, Agent, or Firm* — Blakely Sokoloff Taylor & Zafman LLP

(57) ABSTRACT

An image sensor having a plurality of micro-lenses disposed on a semiconductor substrate. A first micro-lens has a different focal length, height, shape, curvature, thickness, etc., than a second micro-lens. The image sensor may be back side illuminated or front side illuminated.

11 Claims, 6 Drawing Sheets

(not to scale)

(not to scale)

(not to scale)

(not to scale)

(not to scale)

(not to scale)

IMAGE SENSOR WITH MICRO-LENSES OF VARYING FOCAL LENGTHS

BACKGROUND

1. Field

Embodiments of the present invention relate to image sensors and, in particular, to micro-lenses for image sensors.

2. Discussion of Related Art

In general, conventional image sensors perform well to generate images. A typical image sensor may be fabricated from a complementary metal oxide semiconductor (CMOS) technology. Charge coupled device (CCD) technology is also suitable.

A typical image sensor includes an array of picture elements or pixels. An individual pixel is made up of a photodetector, one or more light filters, and a micro-lens. The typical image sensor operates as follows. Light such as visible light, which is made up of several different colors of light, is incident on the micro-lens. The micro-lens focuses the light to the photodetector through the light filter. The photodetector converts the light into an electrical signal proportional to the intensity of the light detected. Conventional image sensors suffer from some limitations, however. For example, the response of one pixel to a specific color may be better or worse than the pixel's response to another color.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

According to some embodiments of the present invention, a complimentary metal oxide semiconductor (CMOS) image sensor may have an array of pixels. At least two pixels may have a micro-lenses disposed therein. The heights of the micro-lenses may be different from each other. Alternatively, the shapes of the micro-lenses may be different from each other. Alternatively still, the focal lengths of the micro-lenses may be different from each other. One advantage of having an image sensor that has micro-lenses with varying shapes, heights, curvatures, and/or focal lengths according to embodiments of the present invention is that the responsiveness of one pixel to a particular color (e.g., black white, grays, red, blue green, etc.) may be improved while the responsiveness of the other pixel to another color also may be improved. That is, pixels can be tailored to respond to particular colors. Embodiments of the present invention use a gray scale mask to tailor the pixels to the particular color. Other features and advantages of the present invention will be apparent from the accompanying drawings and from the detailed description that follows.

Figure 1:
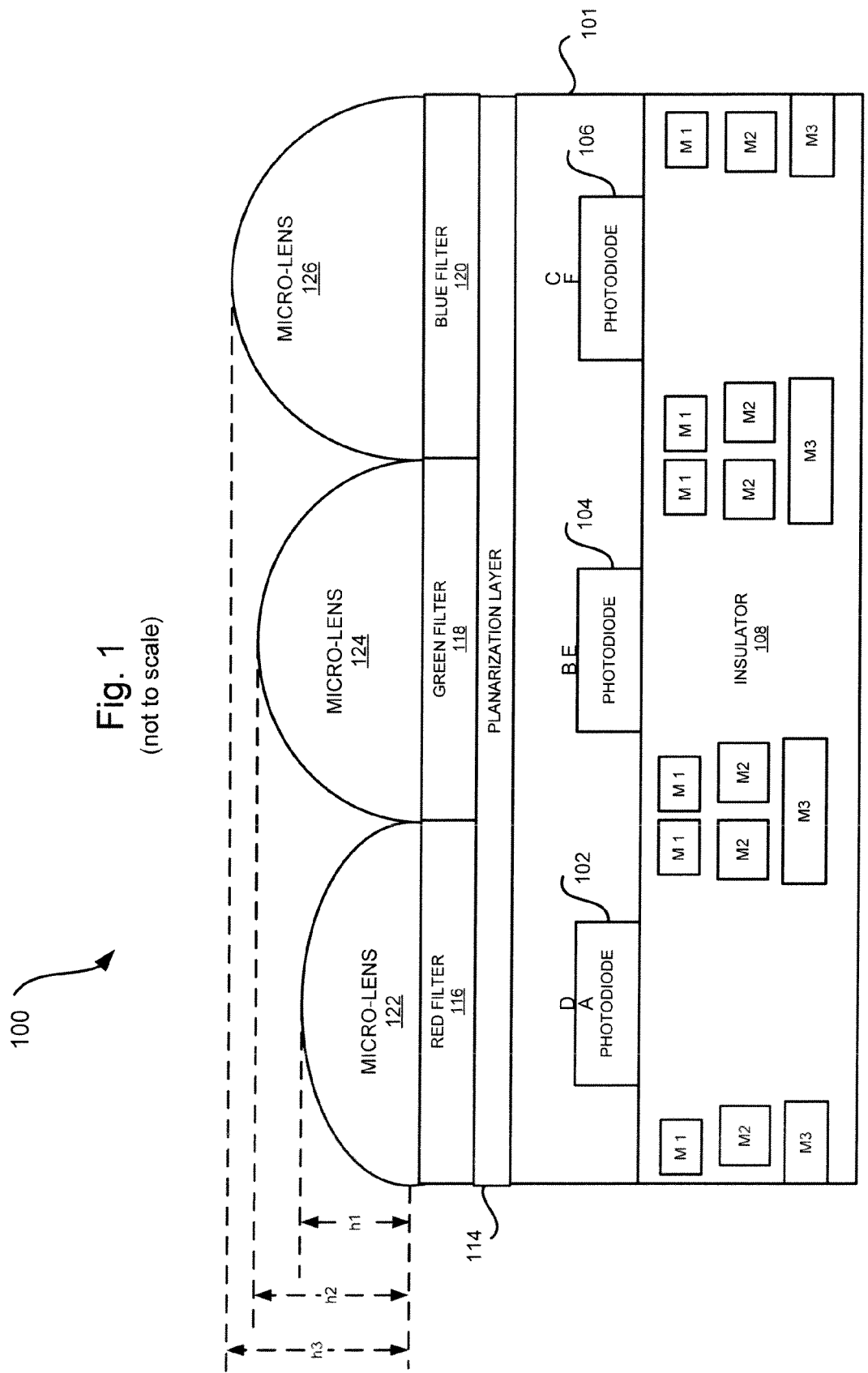
FIG. 1 is a side view of an image sensor that has micro-lenses of varying heights, shapes, curvatures, and/or focal lengths according to an embodiment of the present invention.

FIG. 1 is a side view of an image sensor 100 that has micro-lenses of varying heights, shapes, and/or focal lengths according to an embodiment of the present invention. Generally, the image sensor 100 includes several photosensitive elements arranged in an array of two dimensional rows and columns in a substrate 101.

In the illustrated embodiment, there are three photosensitive elements, which are shown as photodiodes 102, 104, and 106. Of course, the array can include upwards of thousands of rows and/or columns, or more. Similarly, the array may have an arrangement other than columns and rows.

On one side of the substrate 101, several metal conductors M1, M2, and M3 are disposed in an insulator 108. A planarization/passivation layer 114 is disposed on another side of the substrate 101. Several filters shown as a red filter 116, a green filter 118, and a blue filter 120 are disposed on the planarization/passivation layer 114. A micro-lens 122 is disposed on the red filter 116, a micro-lens 124 is disposed on the green filter 118, and a micro-lens 126 is disposed on the blue filter 120.

For some embodiments, the refraction of the micro-lenses 122, 124, and/or 126 varies with the wavelength of incident light. The wavelength of red light is greater than the wavelength of green light, which is greater than the wavelength of blue light. Thus, when white light passes through lenses, blue light is refracted more than green light and red light is refracted more than green light. If the micro-lenses 122, 124, and/or 126 were the same shape, height, and had the same focal lengths, red light may be incident on the photodiode 102 at a point A, green light may be incident on the photodiode 104 at a point B, and blue light may be incident on the photodiode 106 at a point C. These points are not necessarily optimal for detecting light.

According to embodiments of the present invention, the micro-lenses 122, 124, and/or 126 have different shapes, heights, and/or focal lengths. As a result, red light may be incident on the photodiode 102 at a point D, green light may be incident on the photodiode 104 at a point E, and blue light may be incident on the photodiode 106 at a point F. These points may be better for detecting the light.

For some embodiments, the focal length f of the micro-lens 122 is smaller than the focal length of the micro-lens 124, which is smaller than the focal length of the micro-lens 126. Among other things, the colors or peak wavelengths of the filters 116, 118, and 120, the thicknesses of the micro-lenses 122, 124, and 126, the radius of curvature for the surface of the micro-lens where light is incident on the micro-lenses 122, 124, and 126, etc., may determine the focal length of a particular micro-lenses 122, 124, and 126. For some embodiments, the thickness of a micro-lens may be in the range of approximately 0.3 to 3.0 micrometers.

In the illustrated embodiment, the micro-lens 122 has a height h1, the micro-lens 124 has a height h2, and the micro-lens 126 has a height h3. Note that h3 is greater than h2, which is greater than h1. During fabrication, the heights or thicknesses of the micro-lenses 122, 124, and 126 are determined based on the desired focal lengths for the micro-lenses 122, 124, and 126. That is, the different heights result in different focal lengths for the micro-lenses 122, 124, and 126. In the illustrated embodiment, the micro-lenses 122, 124, and 126 also have different shapes, which are determined based on, among other things, the desired focal lengths.

Because the micro-lenses 122, 124, and 126 have different shapes, heights, and/or focal lengths, more red light may fall on the pixel made up of the photodiode 102, the red filter 116, and the micro-lens 122. Similarly, more green light may fall on the pixel made up of the photodiode 104, the green filter 118, and the micro-lens 124. Likewise, more blue light may fall on the pixel made up of the photodiode 106, the blue filter 120, and the micro-lens 126. That is, each pixel may be tailored to respond its associated color or peak wavelength.

For some embodiments, the substrate 101 may be a semiconductor substrate. For some embodiments, the substrate 101 is a doped silicon substrate.

For some embodiments, the photosensitive elements 102, 104, and 106 may be any suitable device that converts light into an electric signal. The photosensitive element may be a photodiode as shown or other solid state device. Other photosensitive elements also may be utilized as well.

For some embodiments, the dielectric material 108 may be any suitable insulator such as an oxide. For some embodiments, the dielectric material may be a silicon oxide.

For some embodiments, the M1, M2, and M3 metal conductors may be copper, aluminum, an aluminum-copper mixture, or other metal suitable for carrying a signal. The dielectric material 108 may insulate the M1, M2, and M3 metal conductors from each other and the substrate 101.

For some embodiments, the planarization/passivation layer 114 may protect or planarize the substrate 101.

In the illustrated embodiment, the filter 116 is a blue filter that substantially allows blue light to pass but blocks substantially all other light in the visible spectrum, the filter 118 is a green filter that substantially allows green light to pass but blocks substantially all other light in the visible spectrum, and the filter 120 is a red filter that substantially allows red light to pass but blocks substantially all other light in the visible spectrum. Although the filters are shown as a red filter 116, a green filter 118, and a blue filter 120, they need not be these colors. The filters 116, 118, and/or 120 may be cyan, magenta, and/or yellow. Other colors are suitable as well. The filters 116, 118, and 120 may be made from any suitable material. One suitable material for the filters 116, 118, and/or 120 is an acrylic. Polymethylmethacrylate (PMMA) or polyglycidylmethacrylate (PGMA) that has been pigmented or dyed is suitable for embodiments in which the filters are color filter. Other photoresist-type materials that can be dyed or pigmented may also be used.

Although shown as color filters, the filters 116, 118, and/or 120 need not be. For some embodiments, the filters 116, 118, and/or 120 may be filters for black and white photography.

Figure 2:
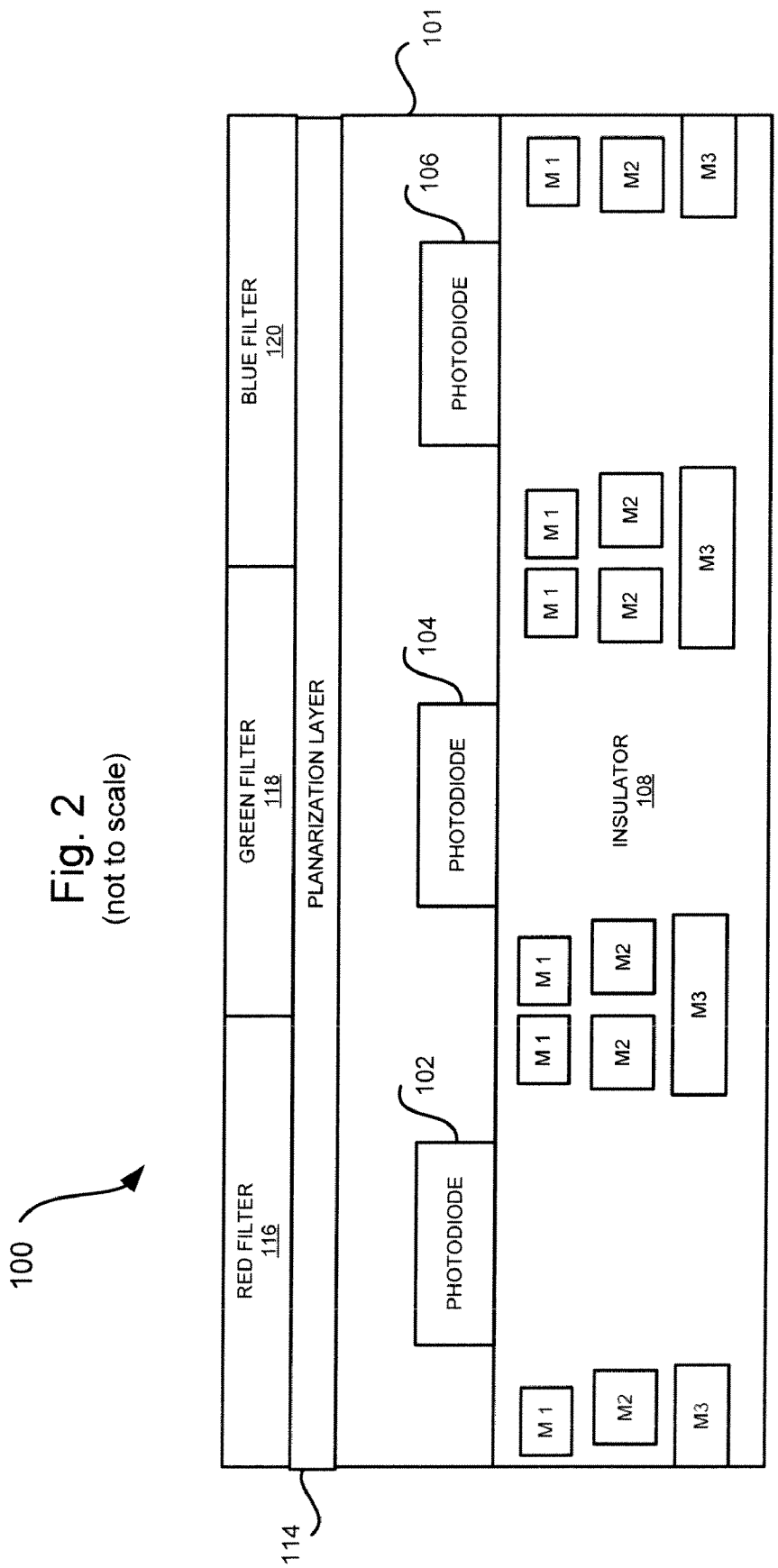
FIG. 2 is a side view of the image sensor in FIG. 1 undergoing a fabrication process according to an embodiment of the present invention.

Fabrication of the image sensor 100 according to at least one embodiment will now be described with reference to FIG. 2 through FIG. 5. The embodiment shown in FIG. 2 shows a first step in the fabrication process. For example, FIG. 2 is a side view of the image sensor 100 without the micro-lenses 122, 124, and 126 according to an embodiment of the present invention.

The illustrated embodiment shows/illustrates the photodiodes 102, 104, and 106; the metal conductors M1, M2, and M3 are disposed in the insulator 108; the planarization/passivation layer 114 is disposed on the insulator 108; and the red filter 116, green filter 118, and blue filter 120 are disposed on the planarization/passivation layer 114. Techniques for fabricating the image sensor 100 depicted in FIG. 2 are known and include deposition, etching, masking, implantation, growing, photolithography, etc.

Figure 3:
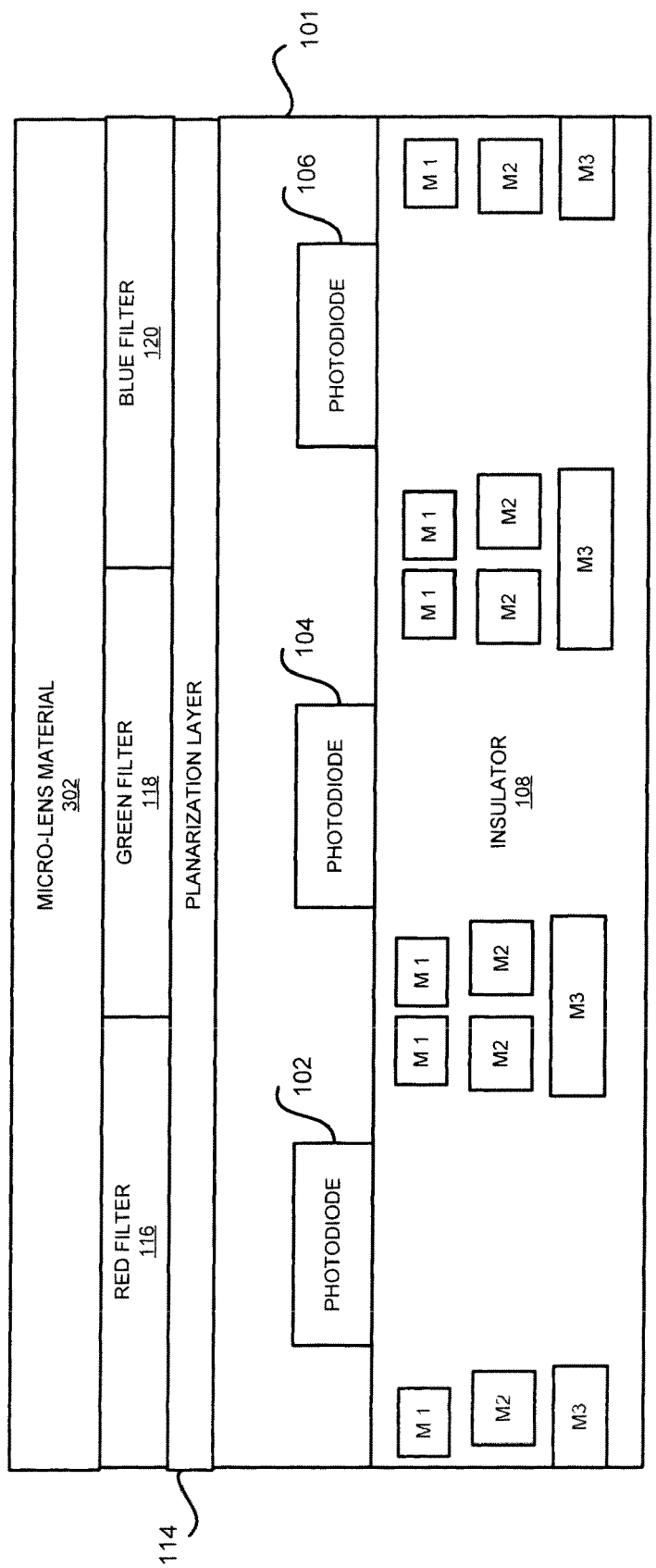
FIG. 3 is a side view of the image sensor in FIG. 1 undergoing a fabrication process according to an embodiment of the present invention.

The embodiment shown in FIG. 3 shows a next step in the fabrication process. For example, FIG. 3 is a side view of the image sensor 100 with micro-lens material 302 disposed on the filters 116, 118, and 120. For some embodiments, the micro-lens material 302 may be disposed using spin-on techniques, blanket deposition techniques, or other methods suitable for disposing the micro-lens material 302 in a substantially planar manner.

The micro-lenses material 302 may be any suitable material. One suitable material is an acrylic. Polymethylmethacrylate (PMMA) or polyglycidylmethacrylate (PGMA) also may be used. Other photoresist-type materials may also be used.

Figure 4:
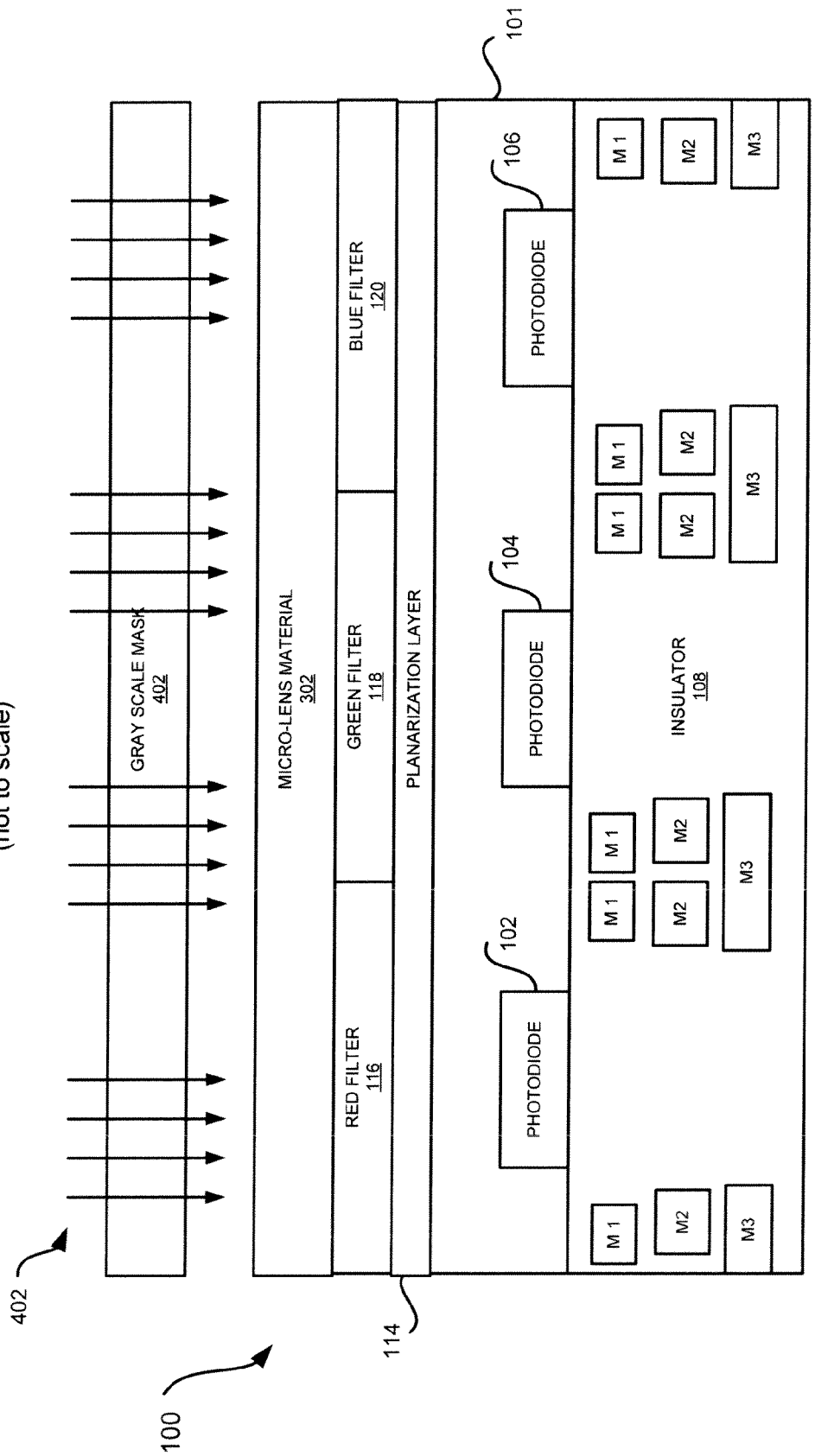
FIG. 4 is a side view of the image sensor in FIG. 1 undergoing a fabrication process according to an embodiment of the present invention.

The embodiment shown in FIG. 4 shows a next step in the fabrication process. For example, FIG. 4 is a side view of the image sensor 100 with micro-lens material 302 being exposed to a source 402 through a gray scale mask 404 according to an embodiment of the present invention. The source 402 and the gray scale mask 404 are used to pattern the micro-lens material 302 into blocks of micro-lens material in a single exposure.

In embodiments in which the source 402 is ultraviolet light and the micro-lens material 302 is a positive photoresist, the portion of the micro-lens material 302 that is exposed to source 402 becomes soluble to the micro-lens material 302 developer and the portion of the micro-lens material 302 that is unexposed remains insoluble to the micro-lens material 302 developer. In embodiments in which the source 402 is ultraviolet light and the micro-lens material 302 is a negative photoresist, the portion of the micro-lens material 302 that is exposed to the source 402 becomes relatively insoluble to the micro-lens material 302 developer. The unexposed portion of the micro-lens material 302 is dissolved by the micro-lens material 302 developer.

For some embodiments, using the gray scale mask 404 allows the thickness of the micro-lens material 302 that remains after exposure to the source 402 and developing to vary due to the varying transmissiveness of the gray scale mask 404. The thickness of the remaining micro-lens material 302 at a given location may depend on the transmissiveness of the gray scale mask 404 at that location.

Figure 5:
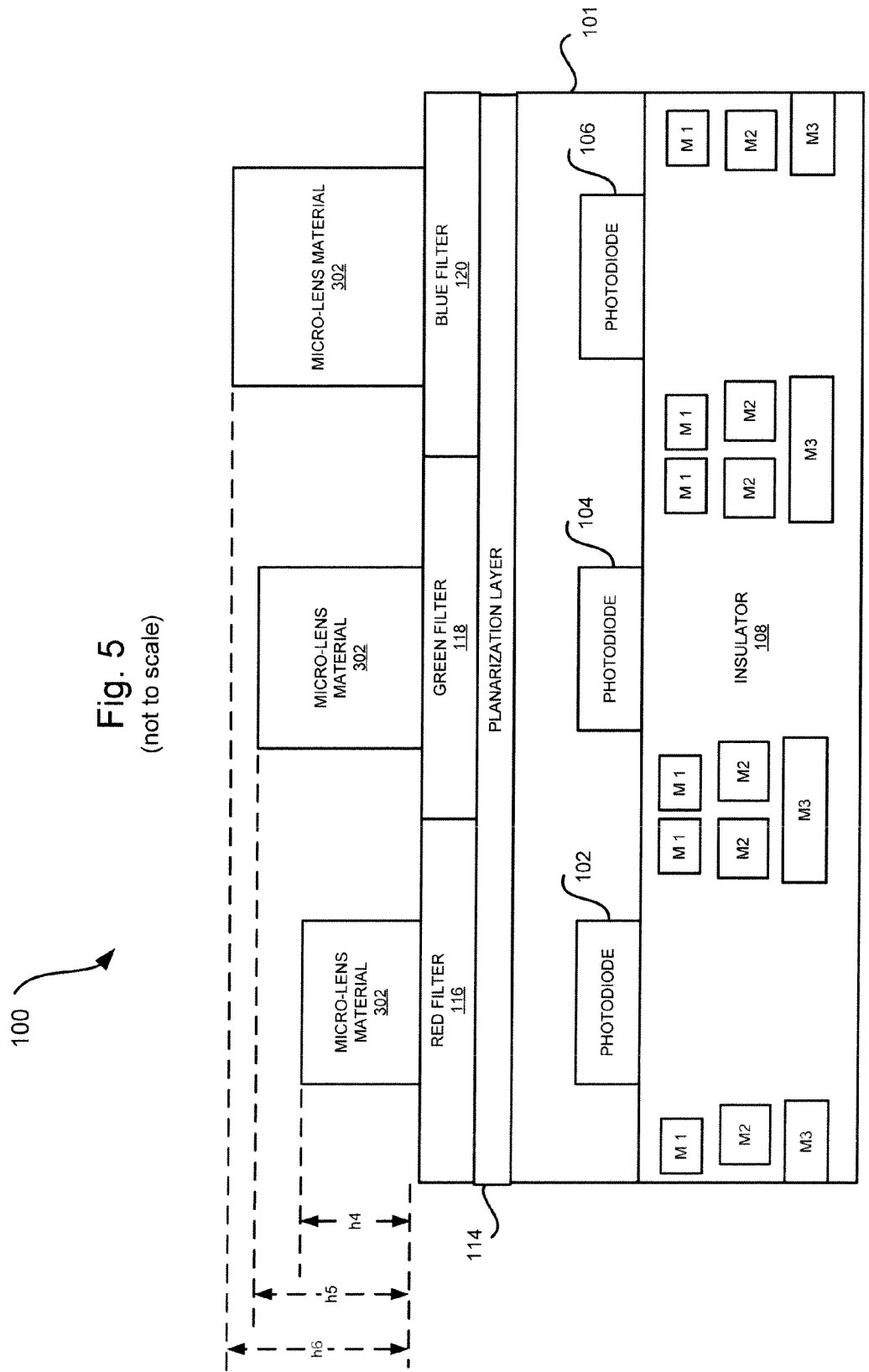
FIG. 5 is a side view of the image sensor in FIG. 1 undergoing a fabrication process according to an embodiment of the present invention.

The embodiment shown in FIG. 5 shows a first step in the fabrication process. For example, FIG. 5 is a side view of the image sensor 100 following exposure and developing of the micro-lens material 302 using the source 402 and the gray scale mask 404 according to an embodiment of the present invention. In the illustrated embodiment, the micro-lens material 302 over the red filter 116 has a height h4, the micro-lens material 302 over the green filter 118 has a height h5, and the micro-lens material 302 over the blue filter 120 has a height h6. Note that h6 is greater than h5, which is greater than h4.

According to embodiments of the present invention, once the micro-lens material 302 is patterned and developed, the remaining micro-lens material 302 may be heated. The micro-lens material 302 may reflow, forming a curvature on the micro-lens material 302. The curvature of the micro-lens material 302 may be different for the micro-lens material 302 over the red filter 116, the micro-lens material 302 over the green filter 118, and the micro-lens material 302 over the blue filter 120. This is because the micro-lens material 302 over the red filter 116 has the height h4, the micro-lens material 302 over the green filter 118 has the height h5, and the micro-lens material 302 over the blue filter 120 has the height h6. After reflow, the result may be the micro-lens 122 having the height h1, the micro-lens 124 having the height h2, and the micro-lens 126 having the height 128, as illustrated in FIG. 1.

Alternatively, the curvature of the micro-lens material 302 may be the same for the micro-lens material 302 over the red filter 116, the micro-lens material 302 over the green filter 118, and the micro-lens material 302 over the blue filter 120, but their heights may be different after reflow processing. The different heights also may be tailored to the particular color to be processed by the photosensitive element.

In the embodiment illustrated in FIG. 1, the micro-lenses 122, 124, and 126, the filters 116, 118, and 120, and the planarization/passivation layer 114, are on one side of the substrate 101 and the M1, M2, and M3 metal conductors disposed in the insulator 108 are on another side of the substrate 101. This embodiment may be referred to as a back side illumination (BSI) embodiment. In back side illumination, light does not go through the metal conductors M1, M2, and M3 before reaching the photodiodes 102, 104, and 106. That is, light paths to the points D, E, and F the photodiodes 102, 104, and 106, respectively, do not include the metal layers.

One advantage of back side illuminated image sensors is that as the image sensors become more complex more metal layers may be added without increasing the length of the optical path to the photodetectors. Additionally, the metal conductors in the metal layers may be spaced closer together without substantially affecting the optical path to the photodetectors.

Figure 6:
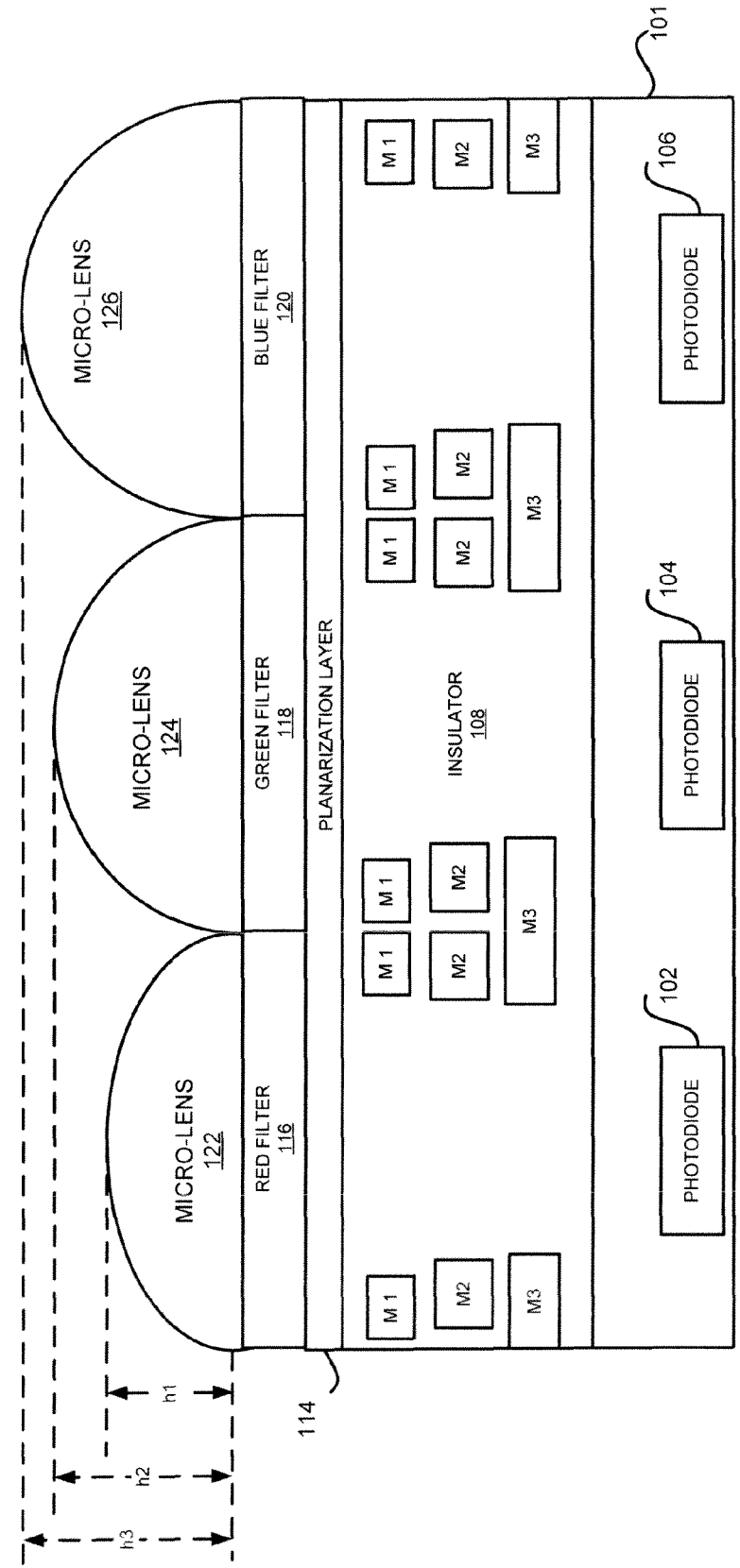
FIG. 6 is a side view of an image sensor that has micro-lenses of varying heights, shapes, curvatures, and/or focal lengths according to an alternative embodiment of the present invention.

FIG. 6 is a side view of an image sensor 600 that has micro-lenses of varying heights, shapes, curvatures, and/or focal points according to an alternative embodiment of the present invention in which the image sensor 600 is front side illuminated (FSI). In the embodiment illustrated in FIG. 1, the micro-lenses 122, 124, and 126, the filters 116, 118, and 120, and the planarization/passivation layer 114, are on one side of the substrate 101 and the M1, M2, and M3 metal conductors disposed in the insulator 108 are on another side of the substrate 101. Although illustrated with the same heights h1, h2, and h3, the heights of the microlenses 122, 124, and 126 may be different.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
  a plurality of micro-lenses disposed on a semiconductor substrate, wherein each micro-lens in the plurality of micro-lenses comprises photoresist, a first micro-lens in the plurality of micro-lenses having a first focal length corresponding to a first transmissiveness at a first location of a gray scale mask;
  a second micro-lens in the plurality of micro-lenses having a second focal length corresponding to a second transmissiveness at a second location of the gray scale mask, wherein the first focal length is different from the second focal length, wherein the first transmissiveness is different from the second transmissiveness, and wherein the first and the second micro-lenses are patterned into blocks by the gray scale mask in a single exposure; and
  a third micro-lens in the plurality of micro-lenses having a third focal length corresponding to a third transmissiveness at a third location of the gray scale mask, wherein the first focal length, the second focal length, and the third focal lengths are different from each other, wherein the first transmissiveness, the second transmissiveness, and the third transmissiveness are different from each other, and wherein the first, the second, and the third micro-lenses are patterned into blocks by the gray scale mask in the single exposure.

2. The image sensor of claim 1, further comprising:
  a first filter disposed on the semiconductor substrate, the first filter associated with a first wavelength; and
  a second filter disposed on the semiconductor substrate, the second filter associated with a second wavelength, wherein the second wavelength is different from the first wavelength.

3. The image sensor of claim 1, further comprising a plurality of metal conductors disposed on the semiconductor substrate.

4. The image sensor of claim 3, wherein the first and second micro-lenses are disposed on a first side of the semiconductor substrate and the plurality of metal conductors is disposed on a second side of the semiconductor substrate.

5. The image sensor of claim 3, wherein the first and second micro-lenses are disposed on a same side of the semiconductor substrate as the plurality of metal conductors.

6. An image sensor, comprising:
  a semiconductor substrate having a first and second photosensitive element;
  a micro-lens material of photoresist disposed above the first and second photosensitive elements; and
  a gray scale mask of varying transmissiveness disposed above the micro-lens material for allowing a varying thickness of the micro-lens material to remain after exposure to a source and developing, the varying thickness of the micro-lens material remaining corresponding to the varying transmissiveness of the grayscale mask.

7. The image sensor of claim 6, further comprising a planarization layer disposed above the first and second photosensitive elements, but below the gray scale mask and the micro-lens material.

8. The image sensor of claim 6, further comprising:
a first filter disposed above the first photosensitive element; and
a second filter disposed above the second photosensitive element.

9. The image sensor of claim 8, further comprising:
the first filter associated with a first wavelength; and
the second filter associated with a second wavelength.

10. The image sensor of claim 6, further comprising:
a first location of the gray scale mask having a first transmissiveness, the first location being disposed above the first filter; and
a second location of the gray scale mask having a second transmissiveness, the second location being disposed above the second filter.

11. The image sensor of claim 10, further comprising:
a first focal length dependent on the thickness of the remaining micro-lens material, disposed below the first location of the gray scale mask; and
a second focal length dependent on the thickness of the remaining micro-lens material, disposed below the second location of the gray scale mask.

* * * * *